United States Patent [19]

Eckart

[11] Patent Number: 5,558,905
[45] Date of Patent: Sep. 24, 1996

[54] METHOD OF MAKING A PYROELECTRIC FILM SENSING DEVICE

[75] Inventor: Donald W. Eckart, Wall, N.J.

[73] Assignee: The United States of America as represented by the Secretary of the Army, Washington, D.C.

[21] Appl. No.: 501,636

[22] Filed: Jul. 12, 1995

Related U.S. Application Data

[63] Continuation of Ser. No. 207,641, Mar. 8, 1994, abandoned.

[51] Int. Cl.$^6$ .................................................... B05D 5/12
[52] U.S. Cl. ................ 427/160; 427/162; 427/126.3; 427/309; 427/419.3; 505/473; 505/474; 216/96; 216/99; 216/101
[58] Field of Search ..................... 250/338.3; 427/160, 427/162, 126.3, 255.7, 419.2, 419.3, 309, 79; 505/473, 474; 216/99, 101, 96

[56] References Cited

U.S. PATENT DOCUMENTS 5,413,667  5/1995  Fujii et al. ................................ 216/20

FOREIGN PATENT DOCUMENTS 2315007   10/1974  Germany ........................... 250/338.3
61-195318  8/1986  Japan ................................. 250/338.3
62-119418  5/1987  Japan ................................. 250/338.3
63-124924  5/1988  Japan ................................. 250/338.3
63-313023 12/1988  Japan ................................. 250/338.3

OTHER PUBLICATIONS

Henry P. Beerman, "Investigation of Pyroelectric Material Characteristics for Improved Infrared Detector Performance." *Infrared Physics*, vol. 15, No. 3 (Sep. 1975) pp. 225–231.

*Primary Examiner*—Roy V. King
*Attorney, Agent, or Firm*—Michael Zelenka; William H. Anderson

[57] ABSTRACT

A substrate free single crystal pyroelectric film particularly suited for use in rapid thermal response sensors is made from a single crystal substrate by a method including the steps of:

(A) etching a pattern into the substrate;

(B) epitaxially growing a highly oriented superconducting material into the etched pattern to fill the etched pattern, (C) epitaxially growing a highly oriented crystalline film of a pyroelectric material over the entire surface of the substrate, and (D) dissolving away the highly oriented superconducting material.

11 Claims, 1 Drawing Sheet

5,558,905

METHOD OF MAKING A PYROELECTRIC FILM SENSING DEVICE

GOVERNMENT INTEREST

The invention described herein may be manufactured, used, and licensed by or for the Government for governmental purposes without the payment to me of any royalties thereon.

This application is a continuation of application Ser. No. 08/207,641, filed Mar. 8, 1994, now abandoned.

FIELD OF INVENTION

This invention relates in general to sensing devices for use in rapid thermal sensors including a highly oriented pyroelectric film and to their method of manufacture and in particular, to a sensing device for use in rapid thermal sensors including a substrate free highly oriented pyroelectric film obtained from a single crystal substrate and to its method of manufacture.

BACKGROUND OF THE INVENTION

Sensing devices for use in rapid thermal response sensors including pyroelectric thick and thin layers have been subject to the influence of the substrate material on which they were deposited. Their ability to respond to thermal changes has depended on the thermal conductivity of the substrate. If the substrate were free standing, the heat loss to the surrounding ambient would be at a minimum and the optical response would be greatly increased. Films that have been attached to substrates have also been restricted in their ability to respond to mechanical deformation. In this sense, a free standing film would act as a deformable membrane and could be used for sensor applications. A free standing film that is to be used as an infrared sensor would not need any cooling to remove heat that accumulates upon absorption of radiation.

Substrate free or free standing films of pyroelectric materials have been made heretofore for use as infrared sensors. These films, however, were grown on glass substrates and as a result were polycrystalline.

SUMMARY OF THE INVENTION

The general object of this invention is to improve performance in devices such as infrared sensors, capacitors, laser detectors, thermal imaging, intruder alarms, fire alarms, pollution monitoring and gas analysis, radiometers and vidicon arrays. A more particular object of the invention is to provide a method whereby a substrate free highly oriented pyroelectric film can be obtained from a single crystal substrate. Another object of the invention is to provide a free standing pyroelectric film that is to be used as an infrared sensor and that will not need any cooling to remove heat that accumulates upon absorption of radiation.

It has now been found that the aforementioned objects can be attained and a substrate free highly oriented pyroelectric film suitable for use as a sensing device in rapid thermal response sensors obtained from a single crystal substrate by a method including the steps of:

(A) etching a pattern into the single crystal substrate, (B) epitaxially growing a highly oriented superconducting material into the etched pattern to fill the etched pattern, (C) epitaxially growing a highly oriented film of a pyroelectric material over the entire surface of the substrate, and (D) dissolving away the highly oriented superconducting material.

In step (A), the single crystal substrate is preferably a material such as Si, MgO, or InSb. The substrate layer is etch patterned to give depressions that are in the order of 1 micron in depth and up to several microns in width.

In step (B), the Si, MgO or InSb single crystal substrate is used to epitaxially grow a highly oriented superconducting material such as 123 superconductor or $Y_1Ba_2Cu_3O_7$ into the depression of step (A) to fill those depressions. The method of growth can be laser ablation, metal oxide chemical vapor deposition, molecular beam epitaxy, sol-gel spin etc.

In step (C), a layer of pyroelectric material such as $PbTiO_3$, $SrTiO_3$, $BaTiO_3$, $Pb(TiZr)O_3$ or $LaLiTi_2O_6$ is epitaxially grown over the entire surface of the substrate.

In step (D), the layer of highly oriented superconducting material is removed by dissolving with dilute nitric acid. The result is a highly oriented pyroelectric film that is not connected to the substrate thus forming a bridge structure. The thermal and mechanical response of the pyroelectric is not subject to the influence of the substrate. The film in this form creates a deformable membrane.

Electrical contacts can be deposited on the substrate before the growth of highly oriented superconducting material. The contact material can be polycrystalline silicon, Pt, Ti, $SiO_2$, SiN etc. A particularly good contact layer is the compound $RuO_2$ since it grows epitaxially with the substrate and the pyroelectric. The layer of highly oriented superconducting material is removed by dissolving it in dilute $HNO_3$, leaving a pyroelectric film that is free standing and yet it is possible to make electrical measurements between the top and bottom. The contact layer should not be soluble in the $HNO_3$ or any other solvent used to dissolve the layer of highly oriented superconducting material.

A stack of alternating pyroelectric layers and air spaces can be made if the contact layer can be epitaxially grown on the pyroelectric layer. Although MgO is not a conductor, it can be used to epitaxially grow spacer layers between the pyroelectric layers. Devices such as these can be used to generate large surface area structures for gas analysis and absorption and collimation of radiation.

DETAILED DESCRIPTION OF THE PREFERRED EMBODIMENT

Figure 1:
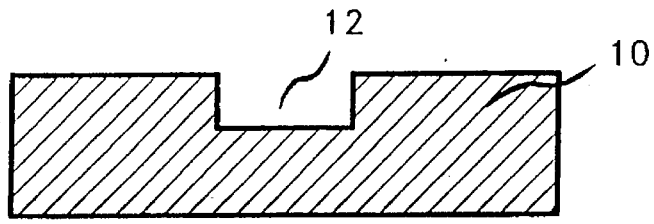
FIG. 1 shows a cross sectional view of a single crystal substrate such as Si, MgO or InSb in which the top surface has been etch patterned to give depressions that are in the order of 1 micron in depth and up to several microns in width.
Figure 2:
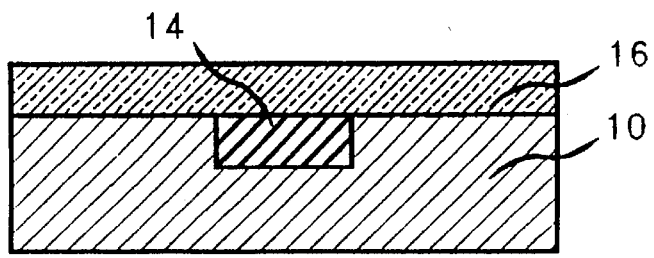
FIG. 2 shows a cross sectional view of the single crystal of FIG. 1 in which the depressions have been filled with an epitaxially grown superconducting layer and a pyroelectric layer then grown epitaxially over the entire top surface of the substrate.
Figure 3:
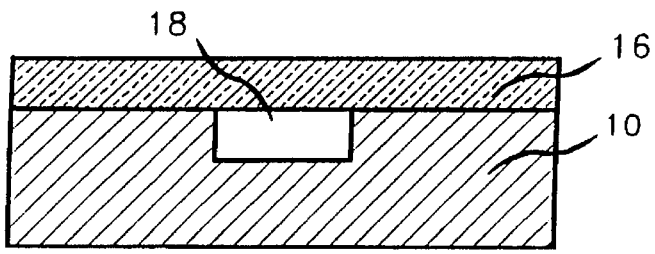
FIG. 3 shows a cross sectional view of the free standing pyroelectric layer that is obtained after the superconducting layer of FIG. 2 has been removed by dissolution in dilute nitric acid. The pyroelectric layer is freestanding in the sense that it is connected with only portions of the substrate.
Figure 4:
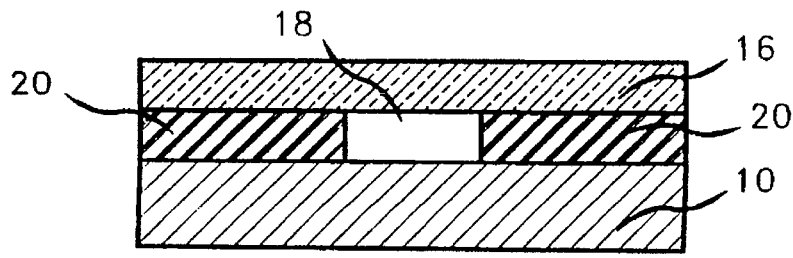
FIG. 4 shows a cross sectional view of the free standing pyroelectric film with electrical contacts that is obtained after the superconducting layer of FIG. 2 has been removed by dissolution in dilute nitric acid. In this instance the electrical contacts are epitaxially deposited before growth of the superconducting and pyroelectric layers.
Figure 5:
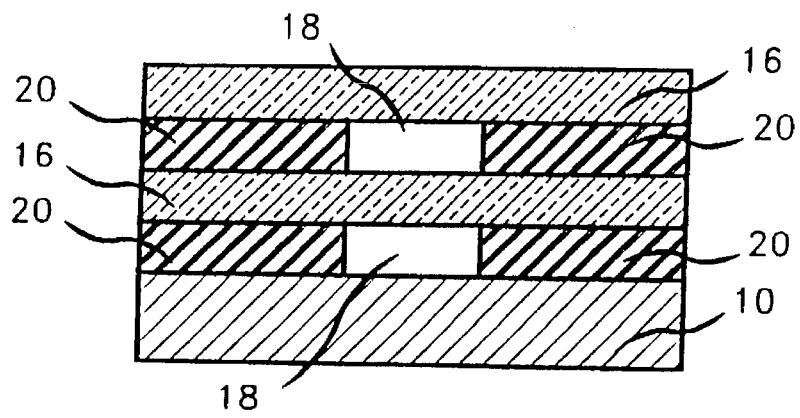
FIG. 5 shows a stack of alternating pyroelectric layers and air spaces that can be made if the contact layer can be epitaxially grown on the pyroelectric layer.

Referring to FIG. 1 to FIG. 5, a single crystal substrate, 10 is etch patterned in its top surface to give depressions, 12. The depressions, 12, are then filled with an epitaxially grown superconducting layer, 14 and a pyroelectric layer, 16 then grown over the entire top surface of the substrate, 10. The superconducting layer, 14 is then removed by dissolution in dilute nitric acid leaving a pyroelectric layer, 16 that is freestanding in the sense that it is only connected with portions,of the substrate, 10 and an air space, 18. If desired, electrical contact, 20 can be deposited on the substrate, 12 before the growth of the superconducting layer, 14. A stack of alternating pyroelectric layers 16, 16', and 16" and air spaces 18, 18', and 18" can be made if the contact layer, 20 can be epitaxially grown on the pyroelectric layer, 16. Although MgO is not a conductor, it can be used to epitaxially grow spacer layers between the pyroelectric layers, 16, 16', and 16" and air spaces 18, 18', and 18" can be made if the contact layer, 20 can be epitaxially grown on the pyroelectric layer, 16. Devices such as these can be used to generate large surfaces area structures for gas analysis and absorption and collimation of radiation.

The method outlined in the foregoing paragraph is carried out to obtain a free standing highly oriented pyroelectric layer using MgO as the single crystal substrate, $YBa_2Cu_3O_7$ as the superconducting layer, 14 and Pb $(TiZr)O_3$ as the pyroelectric layer, 16.

I wish it to be understood that I do not desire to be limited to the exact details of construction shown and described for obvious modifications will occur to a person skilled in the art.

What is claimed is:

1. A method of making a sensing device for rapid thermal response sensors from a single crystal substrate, said method including the steps of:

(A) etching the substrate to form a recess;

(B) epitaxially growing an oriented superconducting material into the recess to fill the recess;

(C) epitaxially growing an oriented film of a pyroelectric material over the entire surface of the substrate; and (D) dissolving away the oriented superconducting material.

2. Method according to claim 1 wherein the pyroelectric film is $PbTiO_3$.

3. Method according to claim 1 wherein the pyroelectric film is $SrTiO_3$.

4. Method according to claim 1 wherein the pyroelectric film is $BaTiO_3$.

5. Method according to claim 1 wherein the pyroelectric film is $Pb(Ti,Zr)O_3$.

6. Method according to claim 1 wherein the pyroelectric film is $LaLiTi_2O_6$.

7. Method according to claim 1 wherein the single crystal substrate is selected from the group consisting of Si, MgO, and InSb.

8. Method according to claim 7 wherein the single crystal substrate is Si.

9. Method according to claim 7 wherein the single crystal substrate is MgO.

10. Method according to claim 7 wherein the single crystal substrate is InSb.

11. Method according to claim 1 wherein the epitaxial grown superconducting material is $YBa_2Cu_3O_7$.

* * * * *